Figure 1:
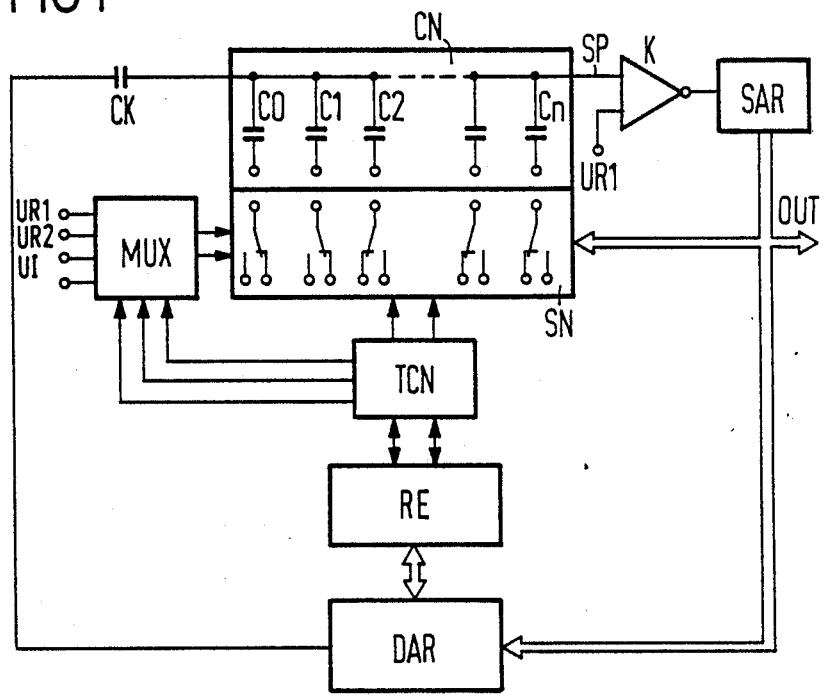

United States Patent [19]

Draxelmayr

[11] Patent Number: 4,970,514
[45] Date of Patent: Nov. 13, 1990

[54] CALIBRATION METHOD FOR REDUNDANT A/D AND D/A CONVERTERS WITH A WEIGHTED NETWORK

[75] Inventor: Dieter Draxelmayr, Villach, Austria

[73] Assignee: Siemens Aktiengesellschaft, Munich, Fed. Rep. of Germany

[21] Appl. No.: 284,300

[22] Filed: Dec. 14, 1988

[30] Foreign Application Priority Data

Dec. 14, 1987 [DE] Fed. Rep. of Germany ....... 3742361

[51] Int. Cl.[5] .............................................. H03M 1/10
[52] U.S. Cl. .................................... 341/120; 341/153; 364/571.01; 364/571.02; 324/130
[58] Field of Search ............... 341/120, 121, 150, 153, 341/172, 155; 364/571.01, 571.02, 571.06; 324/130

[56] References Cited

U.S. PATENT DOCUMENTS 4,336,526 6/1982 Weir .
4,399,426 8/1983 Tan .................................... 341/120
4,451,821 5/1984 Domogalla .

FOREIGN PATENT DOCUMENTS 2022347 12/1979 United Kingdom .

OTHER PUBLICATIONS

IEEE International Solid-State Circuits Conference, vol. 27, Feb. 22–24, 1984, San Francisco, Conf., pp. 64–65, 319 "Self-Calibrating 12b 12mus CMOS-ADC".
IEEE International Solid-State State Circuits Conference, ISSCC 81/ Feb. 18, 1981, "An Error-Correcting 14b/20 mus CMOS A/D Converter", pp. 62–63.
IEEE Transactions on Circuits and Systems, vol. CA-S-30, No. 3, Mar. 1983, "Circuits and Systems Letters", pp. 188–190.
IEEE Transactions on Circuits and Systems, vol. CA-S-25, No. 7, Jul. 1978, "Linear Electronic Analog/Digital Conversion Architectures, Their Origins, etc.

*Primary Examiner*—William M. Shoop, Jr.
*Assistant Examiner*—Brian K. Young
*Attorney, Agent, or Firm*—Herbert L. Lerner; Laurence C. Greenberg

[57] ABSTRACT

A calibration method for redundant A/D and D/A converters with a weighted network and error correction includes performing a self-calibration in which each of n weighted elements is determined as a function of respectively lower weighted elements by means of a measurement with n steps, except for a lowest weighted element. Subsequently each weighted element is calculated and stored in memory in terms of the sum of all of the weighted elements as a function of the results of the measurement with the aid of a calculating register.

11 Claims, 2 Drawing Sheets

CALIBRATION METHOD FOR REDUNDANT A/D AND D/A CONVERTERS WITH A WEIGHTED NETWORK

The invention relates to a calibration method for redundant A/D and D/A converters with a weighted network and error correction.

The most important and critical interface between various types of systems is typically the junction between analog and digital parts of the system. The interface between a digital circuit and an analog circuit requires a D/A converter, while correspondingly the interface between an analog circuit and a digital circuit requires an A/D converter. An ideal converter, which naturally does not actually exist, respectively converts a digital or analog signal without delay and without error into an analog or digital signal. A variety of conversion methods are known, a number of which are described in the paper by Bernard Gordon, "Linear Electric Analog/Digital Conversion Architectures, Their Origin, Parameters, Limitations and Applications", IEEE Transactions of Circuits and Systems, CAS-25, July 1978. The same source includes a paper by P. R. Grey and D. G. Hodges, "All MOS Analog/Digital Conversion Techniques".

In many types of A/D and D/A converters, reference elements are used that derive further variables which are required for conversion from a given reference variable. These reference elements form a weighted network and hereinafter will be referred to as weighted elements. In practice, the weighted networks are typically provided with resistors, capacitors or transistors. Such converters operate, for instance, by the method of successive approximation, a representative example of which may be a converter with charge redistribution, in which the weighted networks include capacitors. Weighted resistor networks are known, for instance, from converters using the method of weighted currents or using a conductor network (R-2R).

In converters with a weighted network, it is important for the weighted elements to be at a precisely predetermined ratio to one another. For high-precision converters, the weighted elements must be highly precise. Problems arise, however, because the weighted elements cannot be manufactured with sufficient precision. Typically, a correction is therefore made, and there are various methods for doing so, but all of them have disadvantages. For instance, laser-trimmed resistor networks are expensive in terms of the manufacturing process and in terms of chip surface area, and they are subject to drift as a function of time. A further correction option is to use a correcting PROM, into which correction values are introduced after the component has been manufactured, as in the trimming process. An example of this is the ICL 7115 component made by Intersil.

A further possibility for calibrating A/D and D/A converters is self-calibration, which is known, for instance, from U.S. Pat. No. 4,451,821 to Domogalla and from the paper by H. S. Lee and D. A. Hodges, "Self-Calibration Technique for A/D Converters", IEEE Transactions on Circuits and Systems, Vol. CAS-30, No. 3, March, 1983. The above-described methods for successive approximation require a binary weighted network, in which two of each of even the smallest elements are provided. In the ideal case, a weighted element is then identically equal to the sum of all of the lower-weighted elements (bits). In this self-calibration technique, the deviation in weight from the sum of all of the variously lower-weighted elements is ascertained incrementally for each weighted element of the network. It is apparent that the weighting error to be assigned to each weighted element can be determined from this difference, which ideally is 0. This error is then stored in memory and is used through a conversion process to correct the result. This weighting error is typically ascertained and stored in memory with the aid of a correction weighting set, for example a calibrating D/A converter or a spatial network. A calculating unit, such as a microcomputer, is required for assigning the correction weights to the various weighted elements. One disadvantage of this known method is that because of the principle of correction of the weighted elements in terms of the particularly ideal value, and because of the calibration steps provided, only binary weighted networks can be used.

An error correction process using a redundant converter to increase the speed and resolution of A/D or D/A converters is also known from the paper by Z. G. Boyacigiller, "An Error Correcting 146/20 us CMOS A/D Converter", ISSCC 81, pp. 62 ff. A redundant A/D or D/A converter of this kind, also known as a code overlapping converter, operates with a weighted network and functions by successive approximation in the method described. In these converters, the ratio of one weighted element to the next lower weighted element is a constant less than 2. In this paper, the ratio is 1.85. The result is redundancy in the encoding, and with the aid of the error correction algorithm presented, errors in the conversion of high-weighted bits, which result from an inadequate settling time of the comparator, are corrected with the aid of lower weight bits.

For calibrating the converter, each bit value is measured and stored in memory with the aid of the internal comparator and an exactly calibrated input voltage. Upon a later conversion, the bits then taken out of the memory are added up in a computer, and the result is present in error-corrected binary code. However, the bit width of the binary code is correspondingly low as compared with the bit width of the redundancy code. Thus far, no self-calibration process for a redundant converter is known.

It is accordingly an object of the invention to provide a calibration method for redundant A/D and D/A converters with a weighted network, which overcomes the hereinafore-mentioned disadvantages of the heretofore-known methods of this general type and with which the conversion speed, resolution and accuracy of the converters can be further improved.

With the foregoing and other objects in view there is provided, in accordance with the invention, a calibration method for redundant A/D and D/A converters with a weighted network and error correction, which comprises performing a self-calibration in which each of n weighted elements is determined as a function of respectively lower weighted elements by means of a measurement with n steps, except for a lowest weighted element, and subsequently calculating and storing in memory each weighted element in terms of the sum of all of the weighted elements as a function of the results of the measurement with the aid of a calculating register.

The invention is based on the concept of providing self-calibration for a redundant converter having a weighted network, wherein the weighted elements are determined with their weighting, and these values obtained are utilized for A/D or D/A conversion, with the aid of a known error correction process.

In accordance with another mode of the invention, there is provided a method which comprises
(a) in steps:
(a1) ascertaining the weight deviation from the sum of the weight of all of the respectively lower weighted elements for each weighted element except for the lowest weighted element of the network, and
(a2) temporarily storing the parameters in memory;
(b) calculating the weighting of each weighted element from the temporarily stored parameters with the aid of the calculating register; and
(c) forming and storing in memory the weighting of each weighted element in terms of the weighting sum of all of the weighted elements of the network.

In accordance with a further mode of the invention, there is provided a method which comprises calculating and storing in memory the weighting of each weighted element as a function of the weight deviations.

In accordance with an added mode of the invention, there is provided a method which comprises calculating and storing in memory the difference in the weighting of each weighted element from the ideal weight of the same element corresponding to the weighted network.

In accordance with an additional mode of the invention, there is provided a method which comprises
(a) in steps,
(a1) ascertaining each weighted element except for the lowest weighted element of the network as the sum of all of the lower weighted elements multiplied by a digital coefficient, and
(a2) temporarily storing the parameters in memory,
(b) calculating the weighting of each weighted element with the aid of a calculating register from the the temporarily stored parameters; and
(c) forming and storing in memory the weighting of each weighted element in terms of the weighting sum of all of the weighted elements of the network In accordance with yet another mode of the invention, there is provided a method having iterative cycles each of which comprises:
(a) in steps,
(a1) ascertaining an error voltage or an error current of the network in terms of the quotient of each weighted element except for the lowest weighted element, and ascertaining the weighting sum of all of the respectively lower weighted elements, and
(a2) temporarily storing the parameters in memory,
(b) calculating the weighting of each weighted element with the aid of a calculating register from the temporarily stored parameters and temporarily storing the result in memory, and
(c) comparing the temporarily stored results element by element with the results of calculated weights optionally temporarily stored in memory in the preceding cycle,
(d) temporarily storing the calculated weights of the weighted elements in memory if a criterion is met, and
(e) forming the weight of each weighted element in terms of the total sum of all weighted elements of the network, storing in memory, and ending the calibration method,
(f) repeating the calculation of the weighted elements of step b) with the weights calculated and temporarily stored in memory in step b).

In accordance with yet a further mode of the invention, there is provided a method which comprises ascertaining and quantifying the error voltages or error currents using the converter to be calibrated itself.

In accordance with yet an added mode of the invention, there is provided a method which comprises specifying a fixed number of cycles as the criterion.

In accordance with yet an additional mode of the invention, there is provided a method which comprises specifying a deviation value between results of two cycles as the criterion.

In accordance with still another mode of the invention, there is provided a method which comprises taking starting weight values for each weighted element from a read only memory in the first calibration cycle.

In accordance with a concomitant mode of the invention, there is provided a method which comprises storing the calculated weight of each weighted element in memory in the form of a word with internal redundancy bit widths.

Other features which are considered as characteristic for the invention are set forth in the appended claims.

Although the invention is illustrated and described herein as embodied in a calibration method for redundant A/D and D/A converters with a weighted network, it is nevertheless not intended to be limited to the details shown, since various modifications may be made therein without departing from the spirit of the invention and within the scope and range of equivalents of the claims.

The method of operation of the invention, however, together with additional advantages thereof will be best understood from the following description of specific embodiments when read in connection with the accompanying drawings.

The invention will now be described in further detail in terms of an A/D converter operating by the method of successive approximation with a weighted capacitor network. Weighted networks of this type are also known from the aforementioned publications by Lee et al, Boyacigiller et al and Domogalla. However, it must be emphasized that the invention is in no way restricted to converters having a capacitor network or to converters that operate by the method of successive approximation. On the contrary, the subject of the invention can be equally advantageously used for converters operating by some other principle.

Figure 2:
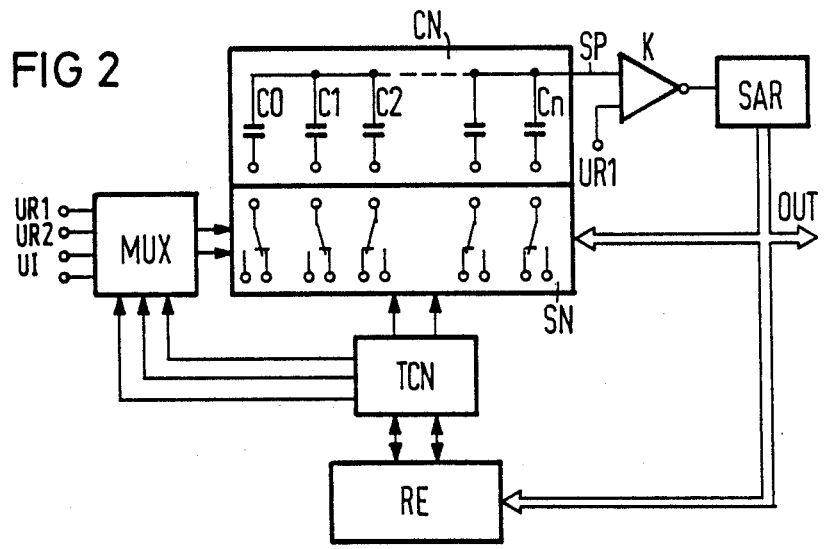
Figure 3:
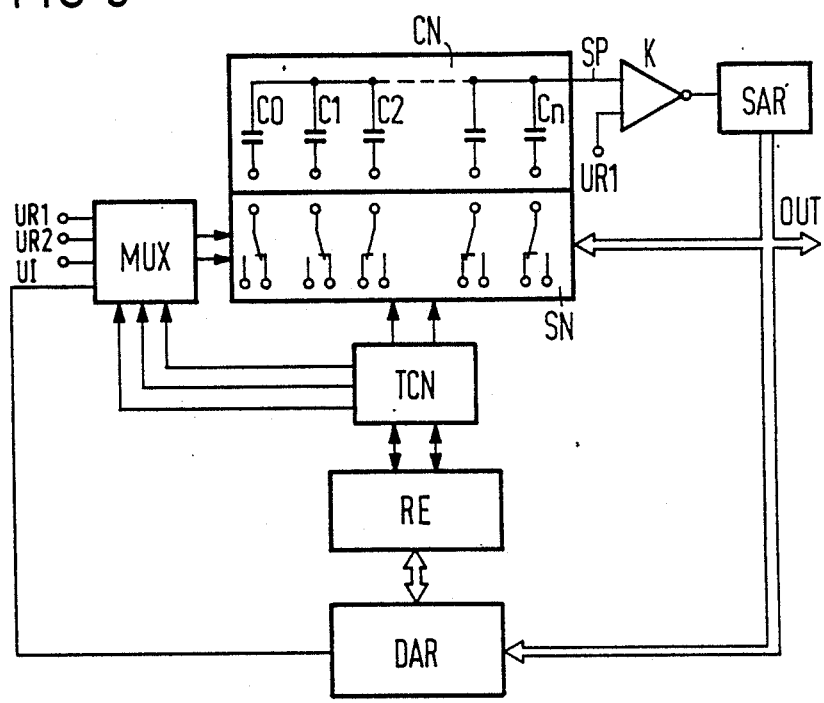

FIGS. 1-3 are schematic and block circuit diagrams of A/D converters which will be used to explain three preferred embodiments of the method according to the invention.

Referring now as a whole to the figures of the drawings, in which identical elements are identified by the same reference numerals, it is seen that the basic elements for performing the method according to the invention are the same in all of the drawings.

Each converter includes a weighted capacitor network CN having capacitors C0-Cn and switches in a switch network SN assigned thereto. An output, which is a summation point SP of the weighted capacitor network CN, is connected to the input of a comparator K. The output of the comparator K is followed by a successive approximation register SAR. On one hand, outputs n of the successive approximation register corresponding to the internal or in other words redundant number n of bits, form an output OUT of the converter. On the other hand, depending on the principle of the converter, these outputs n are fed back to the switch network SN and, depending on the embodiment, to a calculating register RE or to a D/A converter having a DAR register. An input multiplexer MUX having inputs that are defined by two reference voltages UR1 and UR2 as well as by an input UI for an analog signal to be converted, has an output leading to the switch network SN. A time control unit and a calibration logic TCN for performing calibration, control both the multiplexer MUX and the switch network SN and communicate through data lines with the calculating register RE, which naturally includes memory elements Three exemplary embodiments of a method according to the invention will now be described in terms of the configurations shown in the drawings, always on the precondition that the sum of all of the weighted elements, that is the sum of all of the capacitors C0-Cn, is utilized as a reference variable or unit value. The calibration method according to the invention is based on the fact that in n steps, except for the least significant element, each of the weighted elements is represented in terms of the lowest weighted elements at the time, or correspondingly, each bit is represented in terms of the lower weighted bit at the time. The result is an equation system with which each individual weighted element or bit can be calculated in terms of the totality or sum of all of the weighted elements. Thus it is possible to calculate the binary output code in accordance with the Boyacigiller paper.

In practice, first the lowest weighted element is considered along with measurement terms as parameters, and the equation system is calculated as a function of the parameters. Next, the sum of all of the weighted elements is used as a standardizing value, and then the value of each weighted element is calculated in terms of the standardizing value and stored in memory.

A first advantageous exemplary embodiment of the method according to the invention shown in FIG. 1 is particularly suitable for virtually binary weighted networks. In this exemplary embodiment, the output of the D/A converter having the register DAR is connected through a coupling capacitor CK to the summation point SP of the weighted network CN. An exchange of data with the calculating register is possible through data lines. The input of the DAR is formed by the outputs of the successive approximation register SAR.

A capacitor to be tested is identically equal to the sum of all of the lesser capacitors, plus an error term. In steps, each of the capacitors C1-Cn is compared with the sum of the lower weighted elements, and the error term is measured. This method is performed with the aid of the elements shown in FIG. 1. The calculating register RE stores the values or parameters of each step in memory. To this end, the capacitor to be tested, the lower weighted capacitors and the error term are stored in memory. After all of the steps have been completed, the following equation system GS 1 results:

$$\begin{aligned} C1 &= C0 &&+ E1 \\ C2 &= C0 + C1 &&+ E2 \\ \underline{C3 &= C0 + C1 + C2 &&+ E3} \\ Cn &= C0 + C1 + C2 &&\ldots + Cn - 1 + En \\ C0 &+ C1 + C2 + C3 + \ldots + Cn = FS \end{aligned} \quad \text{(GS 1)}$$

The last equation states that the sum of all of the capacitors is equal to the unit or full scale value FS. With the calibration process described above, all of the error terms Ei are ascertained. With the aid of the calculating register RE, the equation system GS 1 is then solved, and the capacitors Ci are represented as a function of the error terms Ei. This method first leads to terms similar to those of the above-mentioned paper by Lee et al. Unlike the known method, in which the error terms remain anonymous and an analog error combination is then performed, in the method according to the invention the error terms are determined in such a way that an analog compensation is not required, and the digital output code of the A/D converter is corrected.

In a further embodiment of this method, the deviations of the capacitors Ci from an ideal value assigned to them can also be represented, if this ideal value is known beforehand. Once the capacitors Ci are determined with the aid of the above-described self-calibration method, the value of each bit corresponding to the associated capacitor is known with respect to the total network. However, since the network Cn is a redundant network, which functions with code overlapping, a code conversion from the redundant code to the binary code is also necessary. This code conversion takes place, for instance, with the aid of the method described by Boyacigiller with simultaneous error correction.

The second exemplary embodiment of a method according to the invention shown in FIG. 2 is also suitable for networks that are not virtually binary weighted, that is in which the code overlapping of the network is greater In FIG. 2, the output of the successive approximation register SAR is fed back to the calculating register RE. In this method, a D/A converter is not necessary. In this second exemplary embodiment, each capacitor or each weighted element is represented as a sum of a number of less significant capacitors or lower weighted elements. However, the prerequisite for performing this exemplary embodiment of the invention is that this is in fact possible In other words, no capacitor or none of the weighted elements is allowed to be greater than the sum of all of the lesser capacitors or lower weighted elements. In practice, however, this is not a major restriction, because a good converter must meet this condition in any case, in order to avoid the creation of missing codes.

With a method according to the invention proceeding in accordance with the first exemplary embodiment, each of the capacitors to be tested is now compared with lower weight capacitors, and the equation system GS 2 is obtained:

$$D_{ij} = \begin{cases} 0 \\ 1 \end{cases}$$

$$\begin{aligned} C1 &= D_{00} \cdot C0 \\ C2 &= D_{10} \cdot C0 + D_{11} \cdot C1 \\ \underline{C3 &= D_{20} \cdot C0 + D_{21} \cdot C1 + D_{22} \cdot C2} \\ Cn &= D_{n0} \cdot C0 + D_{n1} \cdot C1 + \ldots + D_{n,n-1} \cdot Cn - 1 \\ C0 &+ C1 + C2 + \ldots + Cn = FS \end{aligned} \quad \text{(GS 2)}$$

With the method of self-calibration according to the invention, the coefficients $D_{ij}$ are known. The values for the capacitors Ci can then be calculated with the aid of the calculating register RE from the equation system GS 2. Since the coefficients $D_{ij}$ assume the values of 0 or 1, the result of the calculation is accurate to only a limited extent. However, since in principle at least one quantification inaccuracy must be taken into account in every self-calibration method, this restriction is not particularly significant. Moreover, with a redundant converter, more internal bits than would correspond to the required number of binary bits can also be provided.

In the third exemplary embodiment of a method according to the invention shown in FIG. 3, once again each weighted element, or in other words each capacitor, is compared in steps with the sum of all of the lower less significant capacitors. The output of the successive approximation register SAR leads into the D/A converter having the register DAR, which communicates through data lines with the calculating register RE. The output of DAR is applied to a further input of the multiplexer MUX.

In contrast to the first exemplary embodiment presented, in this exemplary embodiment an error term to be added to the sum of the capacitors of the less significant bits is not ascertained. Instead, an error voltage to be applied to the sum of the lower weight elements is ascertained. This error voltage is in the form of a deviation from the unit voltage, since the sum of the less significant elements is after all typically not equal to but rather greater than the weighted element to be determined. As soon as this predetermined voltage component, which is to be applied to the sum of the less significant elements, is known, the exact ratio between this associated bit and the remainder of the weighted network is known. This test is performed for all of the bits. After this first step of the self-calibration method, the following equation system GS 3 is obtained:

$$\begin{aligned} C1 &= (1 - dU1) \cdot C0 \\ C2 &= (1 - dU2) \cdot (C0 + C1) \\ C3 &= (1 - dU3) \cdot (C0 + C1 + C2) \\ Cn &= (1 - dUn) \cdot (C0 + C1 + C2 + \ldots + Cn - 1) \\ C0 &+ C1 + C2 + C3 + \ldots + Cn = FS \end{aligned} \quad \text{(GS 3)}$$

The variables $dUi$ in equation system GS 3 are dimensionless, because they relate to the full scale or unit voltage. With the known error voltages $dUi$, the capacitor values $Ci$ can be calculated with the aid of the calculating register RE. This exploits the feature that the A/D converter to be calibrated can itself be used for quantifying the error voltages $dUi$. The result of the first cycle of this calibration method according to the invention is likewise comparatively inaccurate, because of the relatively inaccurate converter. However, the accuracy of a converter can be iteratively improved by the method according to the invention.

This self-calibration method according to the invention with iterative improvement in accuracy is performed in such a way that in the first cycle, the error voltages $dUi$ are determined with the still relatively inaccurate converter; the capacitors $Ci$ are ascertained; and the error voltages $dUi$ are quantified. In the next cycle of the iterative method, which is a purely calculation cycle, the results obtained in the first cycle are used to enable more accurate determination of the capacitors, and so forth.

The self-calibration method is ended whenever a deviation criterion is attained between the results of two cycles. This deviation criterion is, for instance, derived from the required accuracy of the converter or the possible calculation accuracy for the elements, taking parasitic properties into account. However, a fixed number of calculation loops, for instance 10 or 15, is preferably specified as the criterion.

Both in theory and practice, the self-calibration process according to the invention, with an iterative method, rapidly converges to an exact solution. The quality of the solution depends substantially on the parameters which determine the quality in the converters known from the prior art as well, namely the resolution, offset and noise. Due to the iterative method, extraordinarily high accuracy of the converter is attainable, even though the adaptation tolerances of the converter may amount to several per cent.

In contrast to the redundant converters known from the prior art, with self-calibrating converters according to the method of the invention there is no disadvantageous relationship between the adaptation of the elements and the cost, such as the expense for circuitry. Moreover, the self-calibration method of the invention is unrestrictedly usable for redundant weighted networks, even though redundant converters are comparatively difficult to integrate. Binary converters are more easily used in this respect, because in integration identical structures are very readily manufactured. For this reason, self calibration for redundant converters represents a substantial improvement over all of the known prior art.

The advantage of the method according to the invention, explained in conjunction with the three examples given above, is that it is suitable for redundant weighted networks with no restrictions or only slight restrictions and thus is suitable for converters that function according to the principle of code overlapping. For these converters, the method according to the invention is additionally easy to implement. A further advantage is that a separate calibrating D/A converter is only optionally necessary for the self-calibration method according to the invention. However, there may be greater calculation expense than in comparable self-calibrating methods for binary weighted networks In order to solve the equation system ascertained by measurement, which must be done in the method according to the invention, calculating methods such as those generally known from the prior art are suitable Thus, the first two exemplary embodiments produce an exact solution, by matrix inversion. With the third, iterative method, it is suitable to provide starting values for the calculation. The starting values advantageously represent the ideal values of the weighted elements. Depending on the required memory properties of the memories required for performing the method according to the invention, one of ordinary skill in the art will, for instance, provide a ROM as a starting value memory and a RAM or EEPROM for the correction values or the ascertained capacitor value The foregoing is a description corresponding in substance to German Application P 37 42 361.4, dated Dec. 14, 1987, the International priority of which is being claimed for the instant application, and which is hereby made part of this application. Any material discrepancies between the foregoing specification and the aforementioned corresponding German application are to be resolved in favor of the latter.

I claim:

1. Calibration method for redundant A/D and D/A converters with a weighted network and error correction, which comprises performing a self-calibration in which each of n weighted elements is determined as a function of respectively lower weighted elements by means of a measurement with n steps, except for a lowest weighted element, and subsequently calculating and storing in memory each weighted element in terms of the sum of all of the weighted elements as a function of the results of the measurement with the aid of a calculating register.

2. Method according to claim 1, which comprises (a) in steps:
  (a1) ascertaining the weight deviation from the sum of the weight of all of the respectively lower weighted elements for each weighted element except for the lowest weighted element of the network, and
  (a2) temporarily storing the parameters in memory;
(b) calculating the weighting of each weighted element from the temporarily stored parameters with the aid of the calculating register; and
(c) forming and storing in memory the weighting of each weighted element in terms of the weighting sum of all of the weighted elements of the network.

3. Method according to claim 1, which comprises calculating and storing in memory the weighting of each weighted element as a function of the weight deviations.

4. Method according to claim 1, which comprises calculating and storing in memory the difference in the weighting of each weighted element from the ideal weight of the same element corresponding to the weighted network.

5. Method according to claim 1, which comprises
(a) in steps,
  (a1) ascertaining each weighted element except for the lowest weighted element of the network as the sum of all of the lower weighted elements multiplied by a digital coefficient, and
  (a2) temporarily storing the parameters in memory,
(b) calculating the weighting of each weighted element with the aid of a calculating register from the temporarily stored parameters; and
(c) forming and storing in memory the weighting of each weighted element in terms of the weighting sum of all of the weighted elements of the network.

6. Method according to claim 1, having iterative cycles each of which comprises:
(a) in steps,
  (a1) ascertaining an error voltage or an error current of the network in terms of the quotient of each weighted element except for the lowest weighted element, and ascertaining the weighting sum of all of the respectively lower weighted elements, and
  (a2) temporarily storing the parameters in memory,
(b) calculating the weighting of each weighted element with the aid of a calculating register from the temporarily stored parameters and temporarily storing the result in memory, and
(c) comparing the temporarily stored results element by element with the results of calculated weights optionally temporarily stored in memory in the preceding cycle,
(d) temporarily storing the calculated weights of the weighted elements in memory if a criterion is met, and
(e) forming the weight of each weighted element in terms of the total sum of all weighted elements of the network, storing in memory, and ending the calibration method,
(f) repeating the calculation of the weighted elements of step b) with the weights calculated and temporarily stored i memory in step b).

7. Method according to claim 6, which comprises ascertaining and quantifying the error voltages or error currents using the converter to be calibrated itself.

8. Method according to claim 6, which comprises specifying a fixed number of cycles as the criterion.

9. Method according to claim 6, which comprises specifying a deviation value between results of two cycles as the criterion.

10. Method according to claim 6, which comprises taking starting weight values for each weighted element from a read only memory in the first calibration cycle.

11. Method according to claim 1, which comprises storing the calculated weight of each weighted element in memory in the form of a word with internal redundancy bit widths.

* * * * *